United States Patent
Irvine et al.

(10) Patent No.: US 9,203,346 B2
(45) Date of Patent: Dec. 1, 2015

(54) LOAD CURRENT SENSOR FOR ENVELOPE TRACKING MODULATOR

(71) Applicant: Futurewei Technologies Inc., Plano, TX (US)

(72) Inventors: Robert Irvine, Greensboro, NC (US); Hong Jiang, Kernersville, NC (US)

(73) Assignee: Futurewei Technologies, Inc., Plano, TX (US)

(*) Notice: Subject to any disclaimer, the term of this patent is extended or adjusted under 35 U.S.C. 154(b) by 27 days.

(21) Appl. No.: 14/188,305

(22) Filed: Feb. 24, 2014

(65) Prior Publication Data
US 2015/0244325 A1    Aug. 27, 2015

(51) Int. Cl.
| | |
|---|---|
| H03K 7/08 | (2006.01) |
| H03F 1/02 | (2006.01) |
| H03F 3/21 | (2006.01) |
| H03F 3/19 | (2006.01) |
| H03F 1/32 | (2006.01) |
| H04L 25/49 | (2006.01) |
| H04B 1/04 | (2006.01) |

(52) U.S. Cl.
CPC ............ *H03F 1/0216* (2013.01); *H03F 1/3241* (2013.01); *H03F 3/19* (2013.01); *H03F 3/21* (2013.01); *H04B 1/0475* (2013.01); *H04L 25/4902* (2013.01); *H03F 2200/102* (2013.01); *H03F 2200/351* (2013.01); *H03F 2201/3215* (2013.01)

(58) Field of Classification Search
USPC .......... 375/238, 222, 296, 297; 330/279, 136, 330/10, 297; 455/127.2, 95
See application file for complete search history.

(56) References Cited

U.S. PATENT DOCUMENTS

| | | | | |
|---|---|---|---|---|
| 8,570,105 | B2 * | 10/2013 | Wimpenny et al. | 330/136 |
| 2013/0094553 | A1 * | 4/2013 | Paek et al. | 375/222 |
| 2014/0132345 | A1 * | 5/2014 | Wimpenny et al. | 330/136 |
| 2014/0167843 | A1 * | 6/2014 | Asensio et al. | 330/127 |
| 2014/0179250 | A1 * | 6/2014 | Shute | 455/127.2 |
| 2014/0248844 | A1 * | 9/2014 | Langer | 455/127.2 |
| 2015/0017931 | A1 * | 1/2015 | Devison et al. | 455/95 |
| 2015/0054588 | A1 * | 2/2015 | Wimpenny | 330/297 |

* cited by examiner

*Primary Examiner* — Eva Puente
(74) *Attorney, Agent, or Firm* — Robert D. McCutcheon

(57) ABSTRACT

An apparatus and method for sensing load current of an envelope tracking (ET) modulator enables load impedance of a power amplifier to be measured. Impairments associated with the load impedance characteristic can be suppressed by calibration and predistortion instead of by feedback (as done in the prior art). The ET modulator provides a switching regulator that can be reconfigured as a linear regulator for the purpose of sensing the load current. This allows the ET modulator to be operated open-loop, thereby eliminating the power consumption overhead resulting from utilization of a loop filter and error amplifier (used in the prior art) and achieving a higher overall efficiency.

20 Claims, 14 Drawing Sheets

US 9,203,346 B2

LOAD CURRENT SENSOR FOR ENVELOPE TRACKING MODULATOR

TECHNICAL FIELD

The present invention relates to wireless communications and, in particular, to a wireless transmitter having a power amplifier with an envelope tracking modulator.

BACKGROUND

In wireless communication terminals, such as mobile phones and USB modems, modulating the supply voltage of the power amplifier (PA) in such a way as to follow the envelope of the transmitted signal allows the PA to be operated at a higher efficiency. This technique is known as envelope tracking (ET). The circuitry/component that generates the PA supply voltage in this type of system is called an ET modulator.

Turning to FIGS. 1A and 1B, there are shown diagrams illustrating output voltage (Vout) during power amplifier operation when supply voltage $V_{CC}$ is static (FIG. 1A) and when $V_{CC}$ tracks the envelope of Vout (FIG. 1B). In general, when the supply voltage $V_{CC}$ of the power amplifier is lowered, power consumption decreases, therefore increasing efficiency. However, its non-linearity also increases, which degrades the output signal.

When $V_{CC}$ is static, maximum efficiency for nominally linear operation is achieved when $V_{CC}$ is equal to the peak value of the output voltage Vout, as shown in FIG. 1A. When $V_{CC}$ is modulated such that it follows the envelope of Vout, as shown in FIG. 1B, then nominally linear operation is maintained. However, the average value of $V_{CC}$ is lower than if it were static, therefore the average power consumption of the power amplifier is lower and efficiency increases. Thus, there are benefits to utilizing this envelope tracking (ET) technique in power amplifier operation.

Turning now to FIG. 2, there is shown a block diagram of a portion of the circuit/components of a prior art transmitter system 100 within a wireless communications terminal/device. Although other circuitry/components may be included in the transmitter system 100, only those portions necessary and relevant for an understanding of the present disclosure are shown therein. Input signals "ID" and "QD" are the digital in-phase and quadrature components of a baseband signal. Digital-to-analog converters (DACs) 110 convert these signals to corresponding analog components "IA" and "QA". A transceiver 120 (which may include a transmitter) converts IA and QA to a radio-frequency (RF) signal "X". RF signal X is input to a power amplifier (PA) 130 for amplification to generate an RF signal Y at a power level required for transmission from an antenna (not shown) of the transmitter system 100.

Signals ID and QD are also input to an envelope generator 140 that generates an envelope waveform "E" of the transmitted signal. An envelope tracking (ET) modulator 150 receives the waveform E and generates a power amplifier (PA) supply voltage $V_{CC}$ (from the primary supply $V_{sup}$ of the device) using a switching regulator (also known as a switched-mode power supply or switcher). For an "ideal" ET modulator, $V_{CC}$ is identical to the waveform E. For a non-ideal ET modulator, the waveform E can be adjusted (predistorted) to compensate for frequency response and non-linearity of the ET modulator 150 so that $V_{CC}$ more closely corresponds to the waveform E.

Now turning to FIG. 3, there is shown a typical prior art integrated circuit (IC) implementation of a switching regulator 151 in the ET modulator 150, along with a typical prior art filter 155. The switching regulator includes a high side/low side switch 154 which includes transistors $M_1$ and $M_2$ (forming a high-side switch) and transistors $M_3$ and $M_4$ (forming a low-side switch). Typically, a thin oxide is chosen for the switching transistors $M_1$ and $M_4$ in order to allow a high switching frequency at low power consumption. For the cascode transistors $M_2$ and $M_3$, whose gate voltages are held at constant values $V_{cascH}$, $V_{cascL}$, a thick oxide is chosen in order to allow operation at values of $V_{sup}$ that exceed the maximum voltage rating for thin-oxide transistors.

A pulse width modulation (PWM) generator 152 drives the gates of the switching transistors of the switch 154 with non-overlapping (break-before-make) high-side and low-side waveforms PWMH and PWML, whose pulse width as a function of time corresponds to the envelope waveform E. At the output of the switching stage, a low-pass inductor-capacitor (LC) filter 155 formed by $L_1, C_1, L_2, C_2$ and the resistance $R_{load}$ (i.e., the load resistance presented to the filter by the power amplifier) removes the high-frequency components of output voltage $V_{sw}$ output from the switching regulator 152 in order to generate the required power amplifier supply voltage waveform $V_{CC}$.

As will be appreciated, the frequency response of the LC filter depends on the value of $R_{load}$, as illustrated in FIG. 4. For a given $R_{load}$, the inductor and capacitor values can be chosen such that the frequency response is optimal (i.e., it has sufficient flatness within the bandwidth of the envelope signal and provides sufficient attenuation of the higher-frequency components of $V_{sw}$ that are generated by the switching process). In practice, however, $R_{load}$ is a decreasing function of E and $V_{CC}$ and typically varies over a 10:1 range. Because of this, if the filter is optimized for a load near the middle of this range, the frequency response will exhibit excessive peaking during negative excursions of the envelope and excessive droop during positive excursions of the envelope.

One additional consequence resulting from a variation of $R_{load}$ with the power amplifier supply voltage $V_{CC}$ is the non-linearity in the overall transfer characteristic from E to $V_{CC}$ because the gain (or attenuation) is a function of $R_{load}$. Both this non-linearity and the varying frequency response described in the preceding paragraph cause degradation of the transmitted signal.

For a given power amplifier (PA) impedance characteristic, the impact on the frequency response and non-linearity of the ET modulator 150 can be compensated by adjusting (predistorting) the input waveform E of the ET modulator 150. However, because the power amplifier impedance characteristic varies from part to part due to manufacturing characteristic(s) and tolerance(s), it is desirable to measure the power amplifier impedance characteristic of each device/terminal as part of a factory calibration that determines the necessary compensation. In such a process, to perform this measurement, the load current of the ET modulator 150 needs to be sensed.

In one prior art method, the need to measure the load impedance characteristic is avoided by adding a feedback loop, as shown in FIG. 5, that includes a loop filter 160 and summer/adder 161). If the loop gain and loop bandwidth are sufficiently high, the feedback will suppress deviations of $V_{CC}$ from signal E resulting in impairments in the transmitted signal that are acceptably low. The purpose of the loop filter 160 is to provide sufficient loop gain with a frequency response that ensures stability over all variations in $R_{load}$. This is relatively straightforward for a switching regulator with a static output, since the bandwidth can be made arbitrarily low. However, for the ET modulator 150, the high bandwidth requirement (e.g., up to 20 MHz for a long-term evolution (LTE) cellular standard) presents difficulties in the design of the loop filter to achieve sufficient loop gain and bandwidth for the feedback to be effective while maintaining stability over the full range of variation in the load impedance (typically around 10:1, e.g. 4Ω to 40Ω).

Due to the trade-offs between loop gain, bandwidth and stability, most other prior art solutions need an added error amplifier 162 (as shown in FIG. 5) to achieve acceptable transmitter performance. Both the loop filter 160 (which has to be an active filter) and the error amplifier 162 draw power from the primary supply voltage, which reduces the overall efficiency of the system 100 and greatly diminishes the advantages of using envelope tracking.

One challenge in designing a solution that uses envelope tracking is the fact that the load impedance which the power amplifier (PA) 130 presents to the ET modulator 150 varies with the power amplifier supply voltage and with the envelope of the transmitted signal. This causes both variation in the frequency response of the ET modulator 150 and non-linearity in its transfer characteristic, both of which result in degradation of the transmitted signal.

Accordingly, there is a need for a transmitter system that enables the load current of an ET modulator to be sensed, and hence the load impedance of a power amplifier (PA) to be measured. This will enable suppression of the impedance characteristic by calibration and predistortion instead of by feedback.

SUMMARY

According to the present invention, there is provided a transmitter with an envelope generator configured to receive a data signal (to be transmitted) and generate an envelope signal based on the received data signal. An envelope tracking (ET) modulator coupled to the envelope generator is configured to receive the envelope signal, and the envelope tracking modulator comprises a pulse width modulation (PWM) generator and a switching circuit having a first output and a sense output. The PWM generator and the switching circuit are configured to operate as a linear regulator in a first mode and generate a first power amplifier supply signal at the first output as a function of a calibration signal, and operate as a switching regulator in a second mode and generate a second power amplifier supply signal at the first output as a function of the received envelope signal. A current sensor circuit is coupled to the second output of the ET modulator and configured to sense current of the first power amplifier supply signal at the first output. A filter is coupled to the first output of the ET modulator for filtering the second output signal and generating a power amplifier switching supply source. The transmitter further includes a power amplifier coupled to the filter, wherein when in the second mode, the power amplifier is configured to: receive the power amplifier switching supply source as a supply voltage, receive and amplify a first transmitter signal generated from the data signal, and output an amplified transmitter signal.

In another embodiment of the invention, there is provided a method of adjusting for variations in load impedance characteristics of a power amplifier in a transmitter, where the transmitter includes an envelope signal generator and an envelope tracking (ET) modulator, and the ET modulator includes a voltage regulator for supplying power to operate the power amplifier. The method includes operating the voltage regulator as a linear voltage regulator in a first mode, wherein operating in the first mode includes sensing power supplied by the voltage regulator to the power amplifier, calculating load impedance information for the power amplifier, and storing the calculated load impedance information. The method also includes operating the voltage regulator as a switching voltage regulator in a second mode, wherein operating in the second mode includes generating an envelope signal of data to be transmitted by the transmitter, predistorting the envelope signal in accordance with the stored load impedance information, and operating the switching voltage regulator according to the predistorted envelope signal.

In yet another embodiment, there is provided a transmitter including an envelope tracking (ET) modulator having a pulse width modulation (PWM) generator and a switching circuit having a first output and a second output, with the first output coupled to a power amplifier. The PWM generator and the switching circuit are configured to: operate as a linear voltage regulator to supply power via the first output to the power amplifier during a calibration mode of operation, and operate as a switching voltage regulator to supply power, as a function of an envelope signal, via the first output to the power amplifier during a normal mode of operation. A current sensor is coupled to the second output of the ET modulator and configured to sense current output from the first output to the power amplifier.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

The present disclosure describes an envelope tracking power amplifier and compensation system for use in a transmitter within a wireless communication device/terminal in a communications system. Such wireless communications systems may operate in accordance with any protocol, standard or specification, including for example, those such as Global System for Mobile (GSM), Code Division Multiple Access (CDMA), Universal Mobile Telecommunication System (UMTS), Worldwide Interoperability for Microwave Access (WiMAX), WiFi, and the like, as well as others known to those skilled in the art.

Numerous portions or aspects of the communications device/terminal and its transmitter system are omitted for brevity, and only those elements or devices necessary or relevant to an understanding of the present disclosure are described or shown herein.

The present disclosure describes and discloses various embodiments of an apparatus and method use for eliminating the need for a feedback loop and an error amplifier in an ET modulator used with a power amplifier. This results in higher overall transmitter efficiency. In addition, this enables a longer interval before battery recharge is necessary in terminals/devices operating on battery power, such as a mobile phone, smartphone, tablet, laptop computer and the like. Because it eliminates certain components in prior art solutions, the ET modulation can be constructed with a smaller die area resulting in a lower cost. Further, the present disclosure provides a simpler ET modulator circuit design which results in shorter development time, lower development cost and lower development risk.

In general terms, the present disclosure describes various circuitry and method that reconfigures the switching regulator within the ET modulator to a linear regulator. This enables the load current (to the power amplifier) to be sensed using a current mirror that generates a scaled-down replica of the output current of the linear regulator. In other words, the ET modulator operates in one of two different modes: (1) normal or operating mode in which the regulator operates as a switching regulator (normal operation), and (2) calibration mode in which the regulator operates as a linear regulator.

The envelope tracking modulator (and its various embodiments) described herein is part of a cellular terminal, device or base station, and the impedance characteristic measurement is performed as part of a factory calibration when the terminal or base station is manufactured. As will be appreciated, the present disclosure teaches the use of additional components and circuitry within the system to enable the impedance characteristic measurement.

Figure 6:
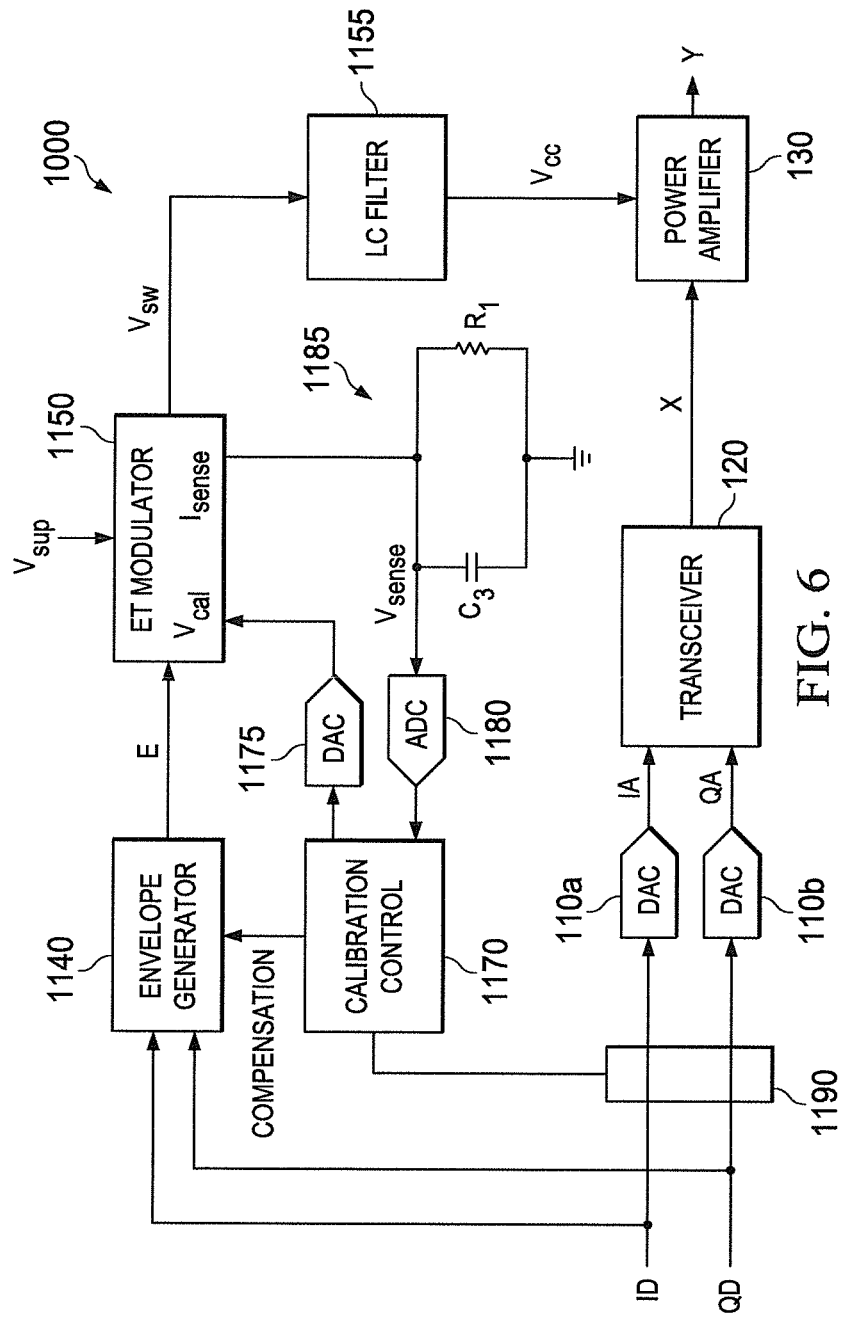
FIG. 6 is a diagram of relevant portions of a transmitter system in accordance with the present disclosure.

With reference to FIG. 6, there are shown the relevant portions of circuit/components of a transmitter system 1000 within a wireless communications terminal/device (such as a base station, wireless communication device, and the like) in accordance with the present disclosure. Although other circuitry/components may be included in the transmitter system 1000, only those portions necessary and relevant for an understanding of the present disclosure are shown therein.

Figure 1A:
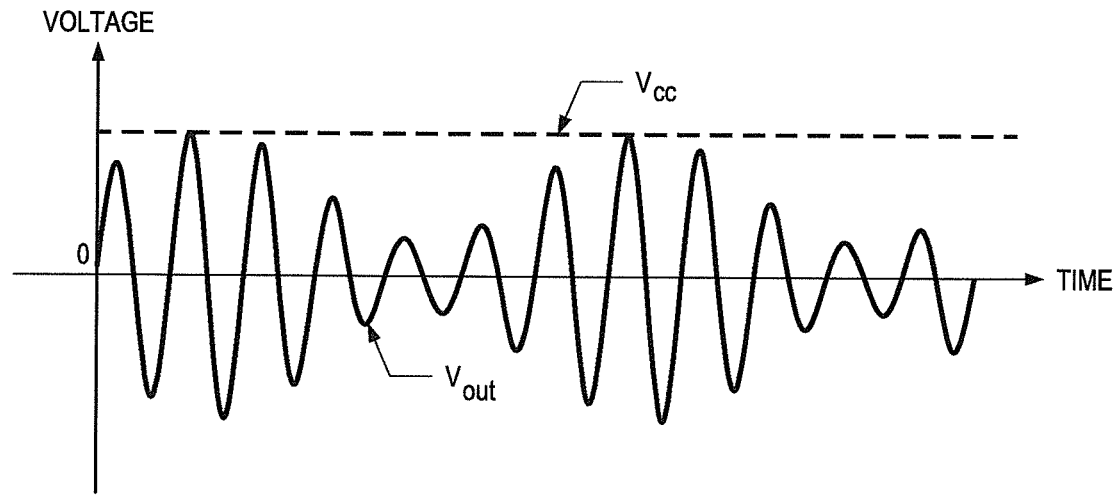
FIGS. 1A and 1B are signal waveforms illustrating power amplifier operation with a static supply voltage and with envelope tracking, respectively.
Figure 1B:
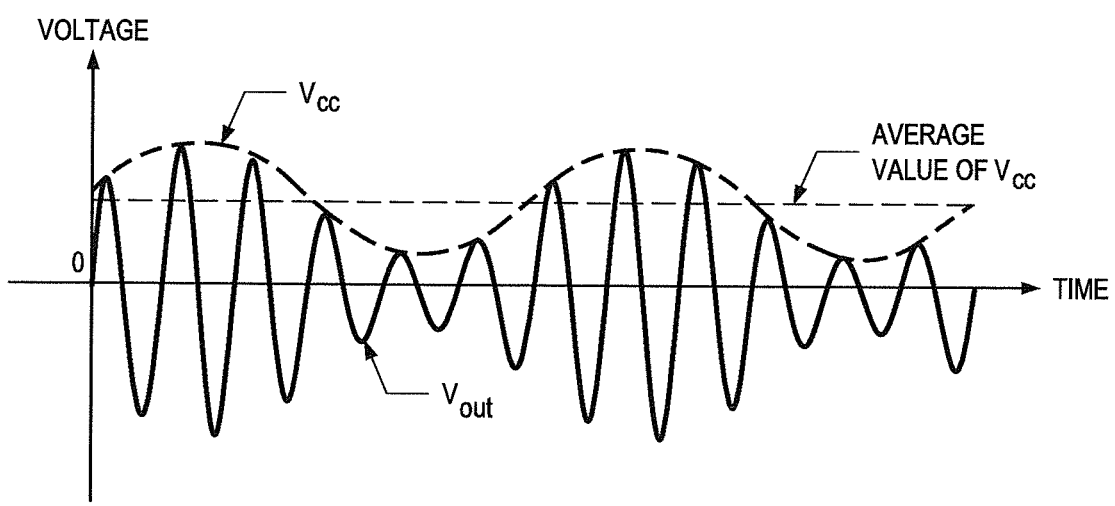
Figure 2:
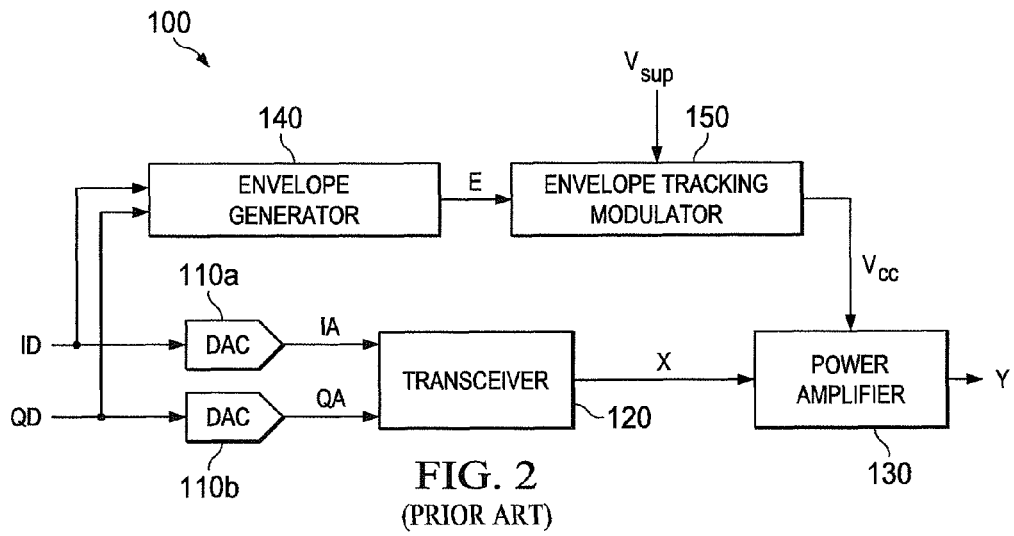
FIG. 2 is a block diagram illustrating a portion of the circuit/components of a prior art transmitter system within a wireless communications terminal/device.

Similar to the system 100 shown in FIG. 2, input signals "ID" and "QD" are the digital in-phase and quadrature components of a baseband signal. Digital-to-analog converters (DACs) 110 convert these signals to corresponding analog components "IA" and "QA". The transceiver 120 (which may include a transmitter) converts IA and QA to a radio-frequency (RF) signal "X". RF signal X is input to the power amplifier (PA) 130 for amplification to generate an RF signal Y at a power level required for transmission from an antenna (not shown) of the transmitter system 1000. As will be appreciated, the DACs 110, the transceiver 120 and the power amplifier (PA) 130 may be the same or similar to the corresponding elements shown on FIG. 2.

Signals ID and QD are also input to an envelope generator 1140 that generates an envelope waveform "E" of the transmitted signal. An envelope tracking (ET) modulator 1150 (which includes an LC filter 1155) receives the waveform E and generates a power amplifier (PA) supply voltage $C_{CC}$ (from the primary supply $V_{sup}$ of the device) using a switching regulator (also known as a switched-mode power supply or switcher) within the ET modulator 1150.

The system 1000 also includes a calibration control circuit 1170, a DAC 1175, an analog-to-digital converter (ADC) 1180, and a sense circuit 1185, configured as shown in FIG. 6. In general, the additional circuitry reconfigures the switching regulator (in the ET modulator 1150) as a linear regulator for the purpose of sensing the load current—which will be described in more detail below.

Figure 7:
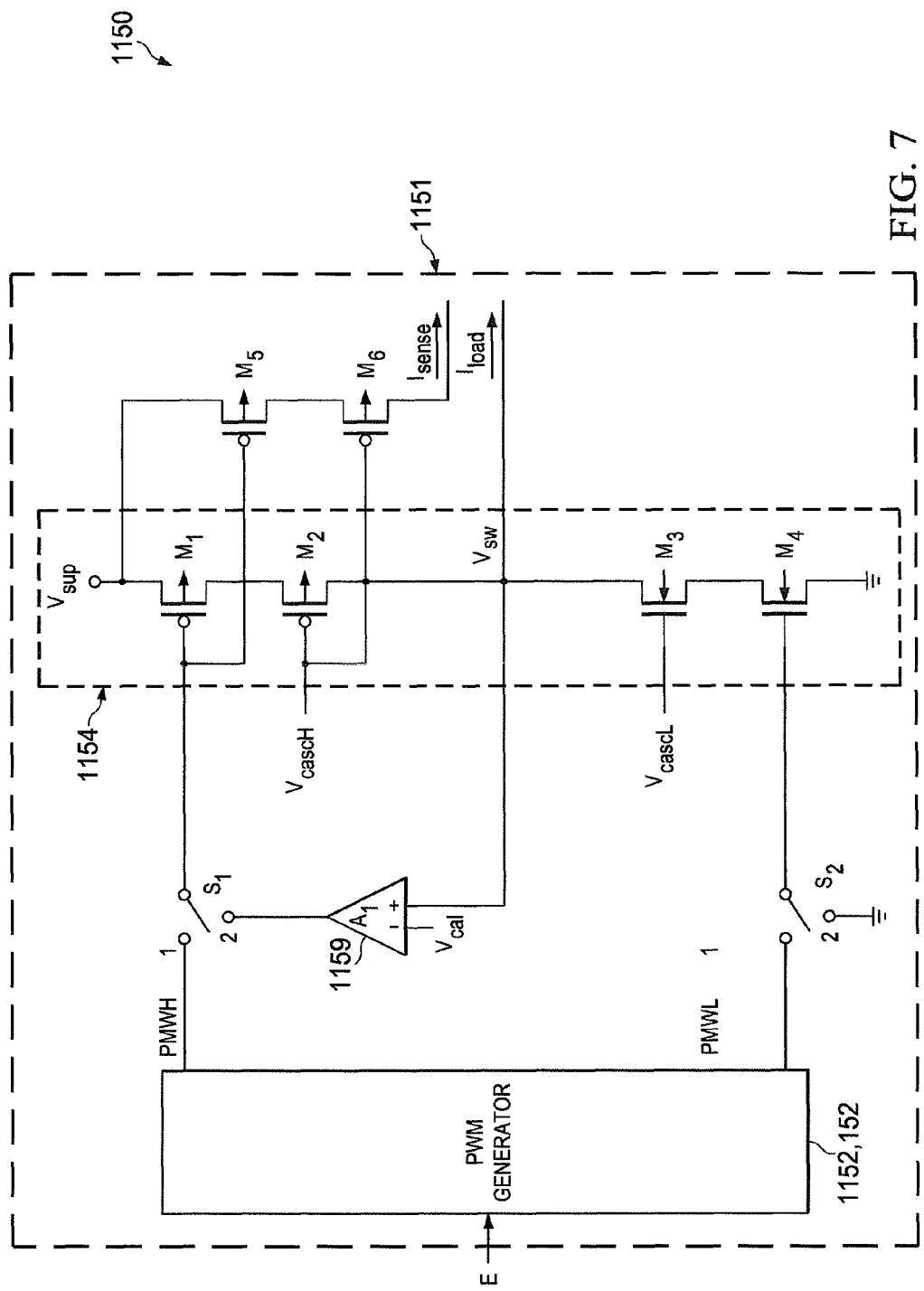
FIG. 7 is a more detailed diagram of the ET modulator shown in FIG. 6.

The calibration control circuit generates a digital input signal to the DAC 1175 which outputs a calibration voltage $V_{cal}$ for input to the ET modulator 1150. The sense circuit 1185 includes a resistor $R_1$ and a capacitor $C_3$ for generating an average voltage value $V_{sense}$ of a sense current $I_{sense}$ generated by the ET modulator 1150. Voltage $V_{sense}$ is input to the ADC 1180 for digital conversion and input to the calibration control circuit 1170. The calibration control circuit 1170 processes $V_{sense}$ and outputs a compensation signal to the envelope generator 1140 to control the predistortion applied to the signal E, which compensates for the frequency response and non-linearity of the ET modulator 1150. The load impedance that the power amplifier (PA) 130 presents to the ET modulator 1150 is calculated as:

$$R_{load} = \frac{V_{sense}}{nR_1}$$

where n is the scaling factor between transistors $M_1$, $M_2$ and $M_5$, $M_6$ (in FIG. 7).

In calibration mode, the calibration control 1170 controls the DAC 1175 in such a way that the calibration voltage $V_{cal}$ is varied in steps between the minimum and maximum values of the supply voltage $V_{CC}$ of the power amplifier 130 that will occur in normal operation. For example, $V_{cal}$ may be swept from 0.5V to 4.5V in steps of 0.1V. At each value of $V_{cal}$, the calibration control 1170 causes the amplitude of the digital baseband signal components ID and QD to vary in such a way that the power $P_X$ of the RF input signal X of the power amplifier 130 is varied in steps between the minimum and maximum values that will occur in normal operation. For example, $P_X$ may be swept from −40 dBm to 10 dBm in steps of 1 dB. This is accomplished by a power adjuster circuit 1190 (shown in FIG. 6). Alternatively, the power adjuster circuit 1190 may be disposed in the IA, QA signal path or implemented as part of the DACs 110a, 110b (to vary the amplitude during the digital-to-analog conversion of the ID, QD digital signals to the IA and QA analog signals). As will be appreciated, this power adjustment may also be performed at another point in the path to the power amplifier 130.

For each pair of values ($V_{cal}$, $P_X$), the calibration control 1170 calculates the load resistance $R_{load}$ as described above. The result is a two-dimensional table of $R_{load}$ values as a function of $V_{cal}$ and $P_X$. This information may be stored in memory (see FIGS. 11A, 11B). The form of the compensation signal that the calibration control 1170 generates and provides to the envelope generator 1140 depends on how the predistortion is implemented. For example, the calibration control 1170 may serially output the $R_{load}$ values that it measures and the envelope generator 1140 may store these values in a look-up table used to calculate the distortion of the LC filter 1155 and apply a corresponding correction to the envelope signal E.

Now turning to FIG. 7, there is provided a more detailed diagram of one embodiment of the ET modulator 1150 in accordance with the present disclosure. The ET modulator 1150 includes both a PWM generator 1152 (which can be the same or similar to the PWM generator 152 shown in FIG. 3) and a switch circuit 1154 which function together as a voltage regulator 1151. As will be appreciated, the regulator 1151 is reconfigurable or programmable to function as either a switching regulator or a linear regulator. The switch circuit 1154 includes a high side switch (formed of transistors $M_1$, $M_2$) and a low side switch (formed of transistors $M_3$, $M_4$).

In one embodiment, the ET modulator 1150 is the same or similar to the prior art ET modulator 150, but with the addition of a transistor $M_5$, a transistor $M_6$, a switch S1, a switch S2, and an amplifier 1159, as shown and configured in FIG. 7.

Figure 3:
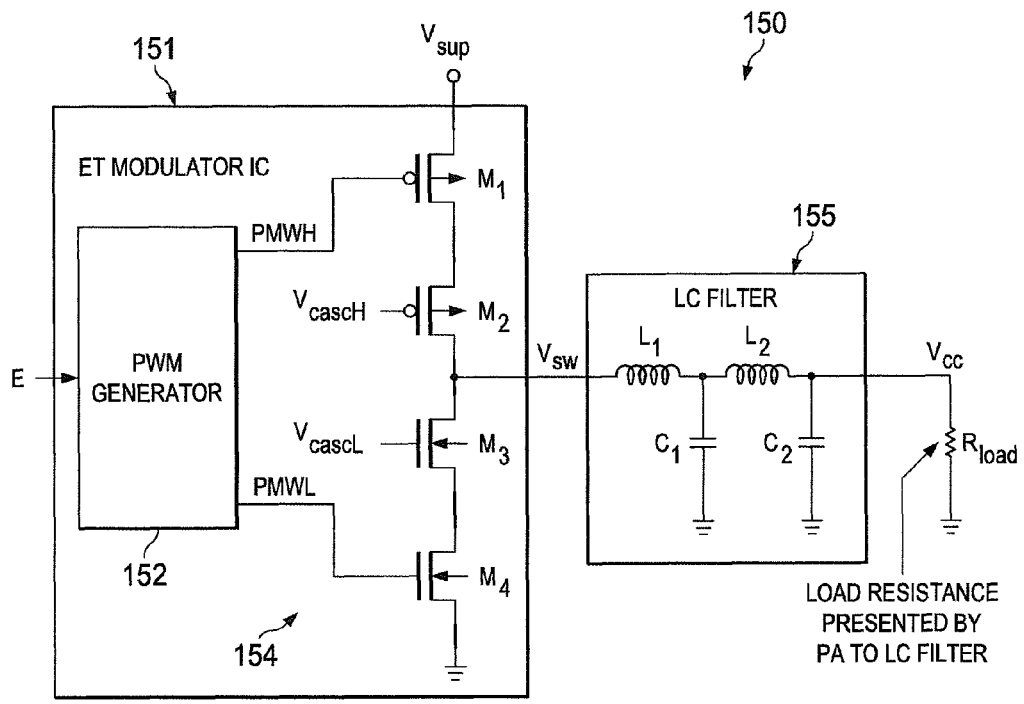
FIG. 3 illustrates a typical prior art integrated circuit (IC) implementation of a switching regulator in a prior art envelope tracking (ET) modulator shown in FIG. 2.
Figure 4:
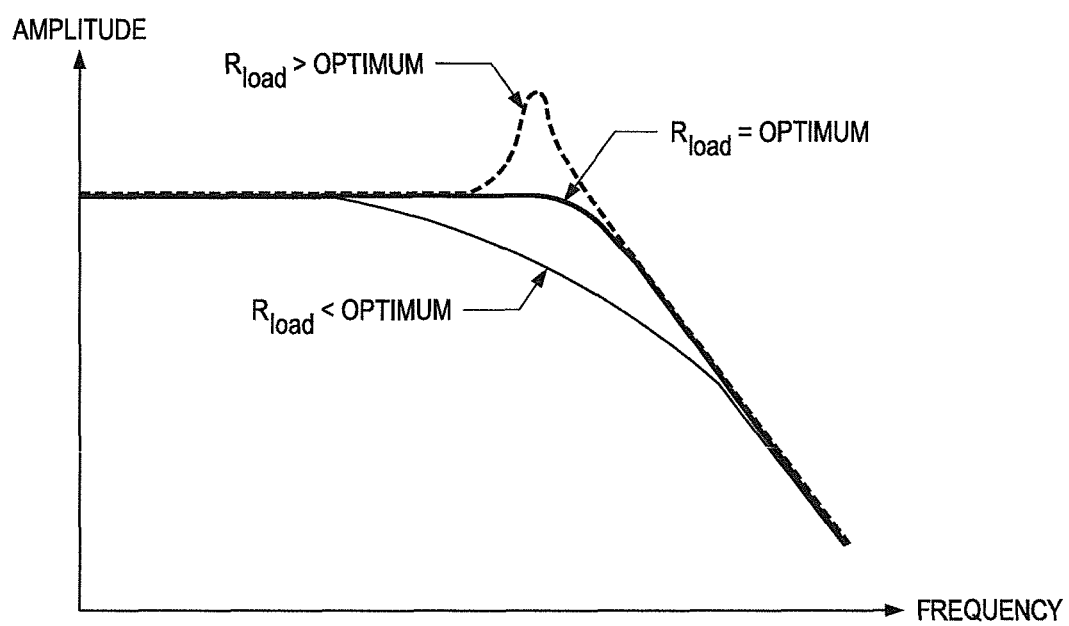
FIG. 4 illustrates how the frequency response of an LC filter depends on the value of the load resistance.

During a first mode of operation (e.g., normal mode), the switches S1 and S2 are set to position 1, and the regulator 1151 operates or functions (is configured) as a switching regulator (as described with respect to FIG. 3). When it is desired to measure the power amplifier (PA) impedance characteristic (e.g., during factory calibration), during a second mode of operation (e.g., measurement or calibration mode) switches S1 and S2 are set to position 2. In this configuration, the regulator 1151 operates or functions (is configured) as a linear regulator (also known as a low drop-out regulator or LDO). In this second mode of operation, the amplifier 1159 operates as the gain stage and the transistors $M_1$ and $M_2$ (now operating as a cascode current source rather than a switch) function as the output device such that the output voltage $V_{SW}$ is equal to the voltage $V_{cal}$ at the inverting input of the amplifier 1159. Transistors $M_5$ and $M_6$ form a current mirror that generates a current $I_{sense}$ which is a scaled-down replica (scaling factor n) of the load current $I_{load}$ flowing through $M_1$ and $M_2$ to the power amplifier 130.

Figure 5:
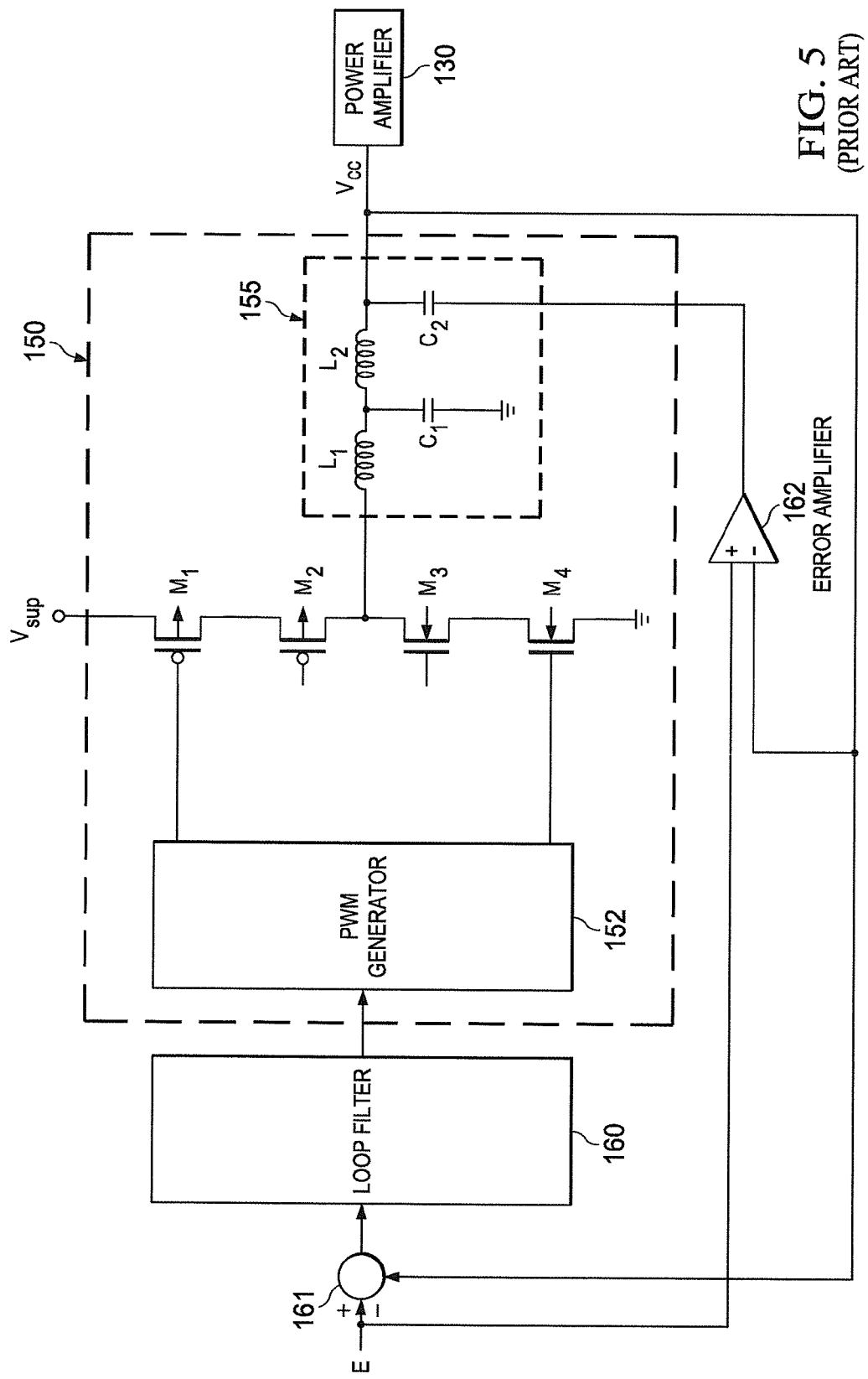
FIG. 5 is a block diagram of the system shown in FIG. 2 with a prior art implementation of a loop filter and error amplifier.

As will be appreciated, the prior art (see FIG. 5) added a feedback loop (with loop filter and error amplifier) to avoid the necessity of measuring the load impedance characteristic. However, with the system 1000 and the teachings herein in accordance with the present disclosure, the measurement of the load impedance characteristic can be performed easily and with little additional circuitry, thereby eliminating the complexity of the prior art feedback loop.

The system 1000 provides a switching regulator that can be reconfigured as a linear regulator for the purpose of sensing the load current. The transistor or transistors that form the high-side switch of the switching regulator form the output current source of the linear regulator, and an added current mirror generates a scaled-down replica of the current flowing in the output current source, which is input to a current sensor.

By sensing the load current of the switching regulator while reconfigured as a linear regulator, the load impedance that the power amplifier presents to an envelope tracking modulator can be measured.

This load impedance measurement is used to determine the variation in the load impedance with the envelope of the signal and the supply voltage of the power amplifier, referred to here as the impedance characteristic. The results of measuring the impedance characteristic are used to predistort the input of the envelope tracking modulator in order to compensate for its (non-ideal) frequency response and non-linearity.

The envelope tracking modulator according to the present disclosure is part of a wireless device/terminal or base station, and the impedance characteristic measurement may be performed as part of a factory calibration when the device/terminal or base station is manufactured.

The system 1000 enables the load current of the ET modulator to be sensed and, hence, the load impedance of the power amplifier to be measured. Impairments associated with the load impedance characteristic can be suppressed by calibration and predistortion instead of by feedback (as done in the prior art). This allows the ET modulator to be operated open-loop, thereby eliminating the power consumption overhead of the loop filter and error amplifier (used in the prior art), and achieves a higher overall efficiency.

Figure 8A:
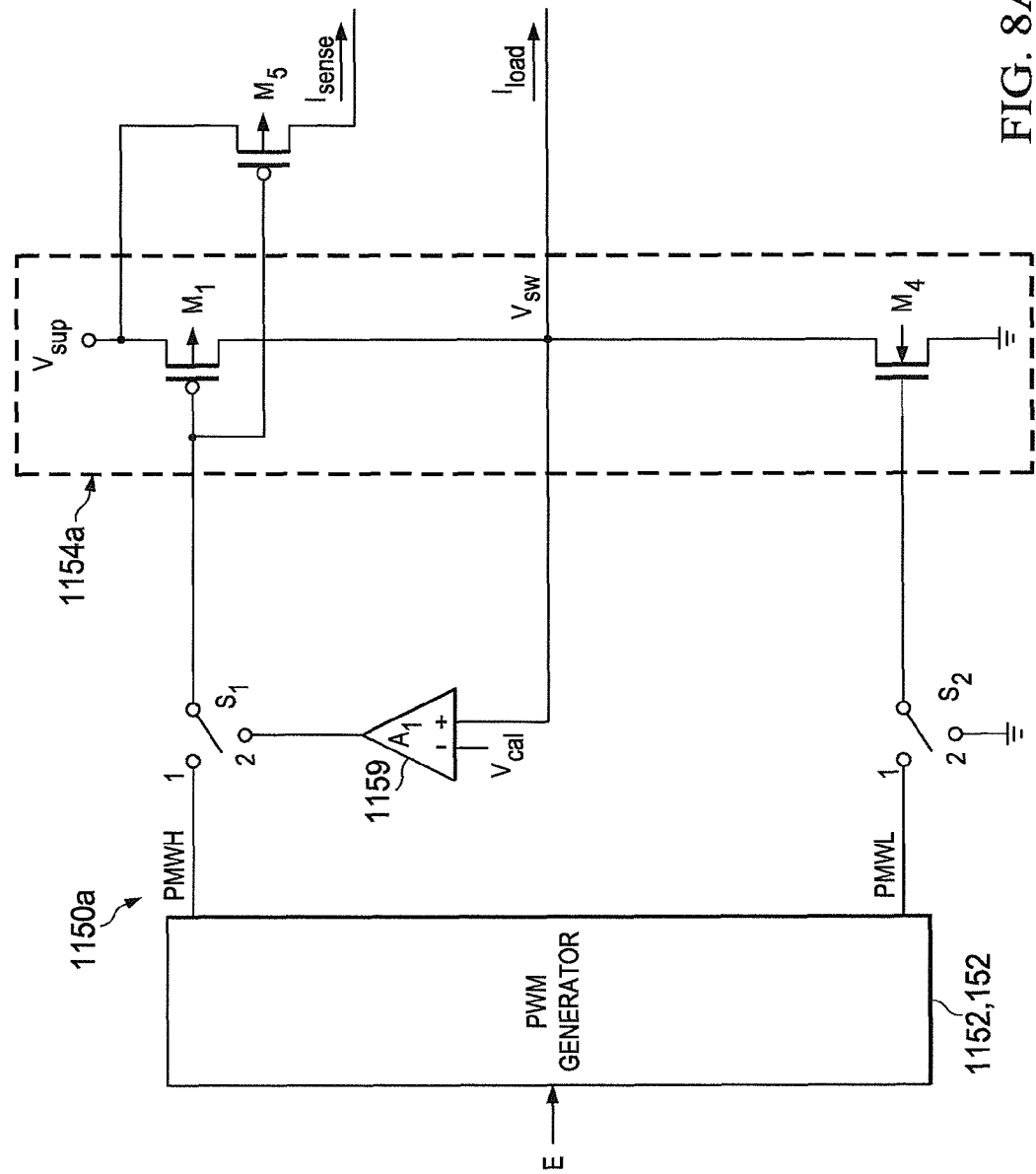
FIGS. 8A-8E are alternative embodiments of the ET modulator shown in FIG. 6.

Now turning to FIG. 8A, there is provided a detailed diagram of another embodiment of the ET modulator 1150 (identified as 1150*a*) in accordance with the present disclosure. The ET modulator 1150*a* includes both the PWM generator 1152 (which can be the same or similar to the PWM generator 152 shown in FIG. 3) and a switch circuit 1154*a* which function together as a regulator. As will be appreciated, the regulator is reconfigurable or programmable to function as either a switching regulator or a linear regulator. The switch circuit 1154*a* is formed of a high side switch (transistor $M_1$) and a low side switch (transistor $M_4$). This configuration is similar to the switch circuit 1154 (shown in FIG. 7) except the high and low side switches do not utilize cascade transistors.

As with the embodiment shown in FIG. 7, during a first mode of operation (e.g., normal mode), the switches S1 and S2 are set to position 1, and the regulator operates or functions (is configured) as a switching regulator. When it is desired to measure the power amplifier (PA) impedance characteristic, during a second mode of operation (e.g., measurement or calibration mode), the switches S1 and S2 are set to position 2. In this configuration, the regulator operates or functions (is configured) as a linear regulator. In this second mode, the amplifier 1159 operates as the gain stage and the transistor $M_1$ (now operating as a current source rather than a switch) functions as the output device such that the output voltage $V_{SW}$ is equal to the voltage $V_{cal}$ at the inverting input of the amplifier 1159. Transistor $M_5$ forms a current mirror that generates a current $I_{sense}$ which is a scaled-down replica (scaling factor n) of the load current $I_{load}$ flowing through $M_1$ to the power amplifier 130 (not shown in FIG. 8A).

Figure 8B:
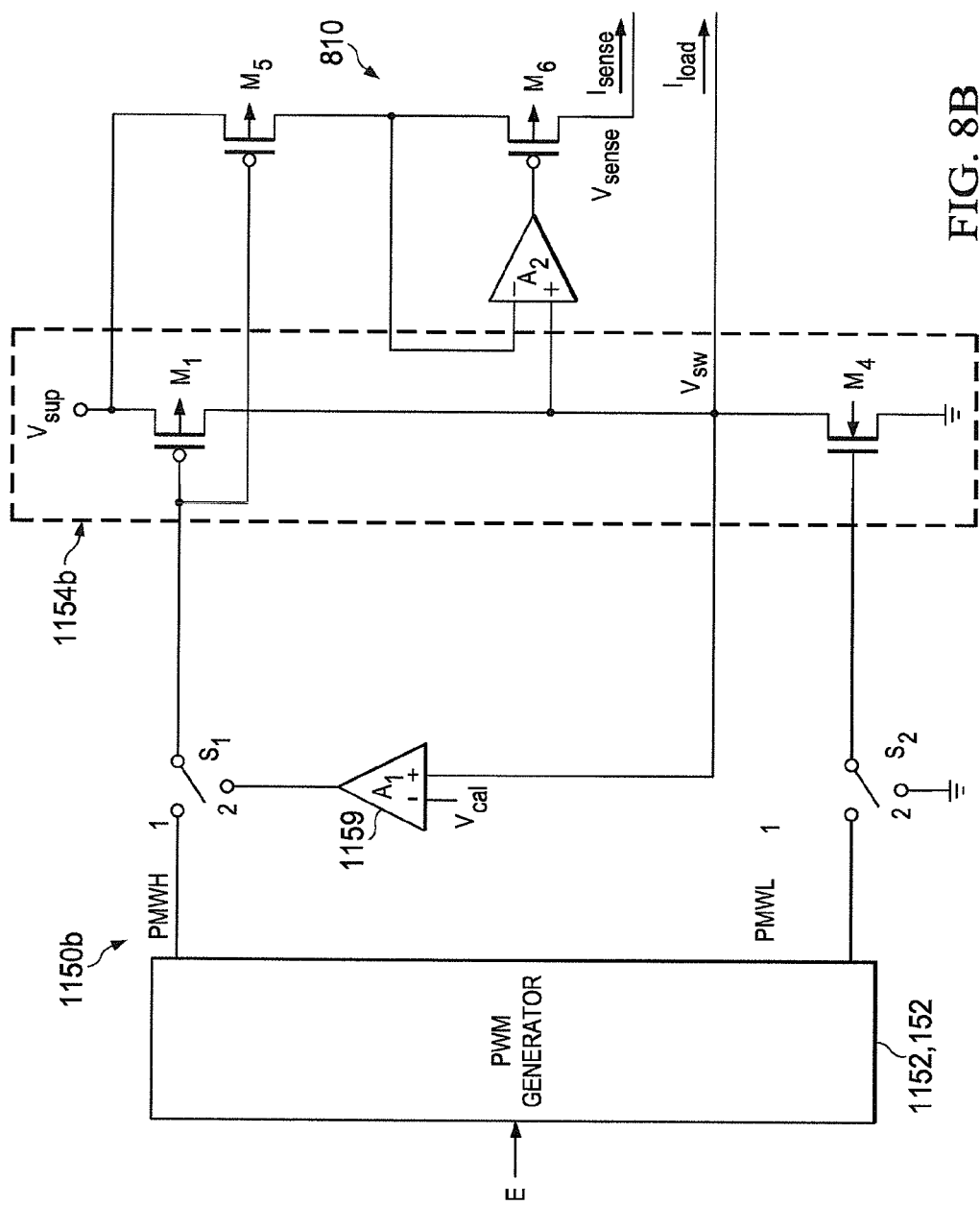

Now turning to FIG. 8B, there is provided a detailed diagram of another embodiment of the ET modulator 1150 (identified as 1150*b*) in accordance with the present disclosure. This embodiment is similar to the embodiment of FIG. 8A with the inclusion of an additional amplifier circuit 810. The ET modulator 1150*b* includes both the PWM generator 1152 (which can be the same or similar to the PWM generator 152 shown in FIG. 3) and a switch circuit 1154*b* which function together as a regulator. The regulator is reconfigurable or programmable to function as either a switching regulator or a linear regulator. The switch circuit 1154*b* is formed of a high side switch (transistor $M_1$) and a low side switch (transistor $M_4$). As will be appreciated, this switch circuit configuration may utilize cascade transistors (though not shown).

As with the prior embodiments, during a first mode of operation, the switches S1 and S2 are set to position 1, and the regulator operates or functions (is configured) as a switching regulator. When it is desired to measure the power amplifier (PA) impedance characteristic, during a second mode of operation (e.g., measurement or calibration mode), the switches S1 and S2 are set to position 2. In this configuration, the regulator operates or functions (is configured) as a linear regulator. In this second mode, the amplifier 1159 operates as the gain stage and the transistor $M_1$ (now operating as a current source rather than a switch) functions as the output device such that the output voltage $V_{SW}$ is equal to the voltage $V_{cal}$ at the inverting input of the amplifier 1159. Transistor $M_5$ forms a current mirror that generates a current for input to the amplifier circuit 810.

The additional amplifier circuit 810 (as shown in FIG. 8B) includes an amplifier $A_2$ having a source follower transistor $M_6$ which maintains the drain voltage of transistor $M_5$ equal to the drain voltage of transistor $M_1$. This improves the accuracy of the current mirror, but the voltage range of $V_{sense}$ is restricted by the requirement that transistor $M_6$ operate in the saturation region. As will be appreciated, the non-inverting input of amplifier $A_2$ may be alternatively connected to $V_{cal}$ instead of $V_{SW}$.

Figure 8C:
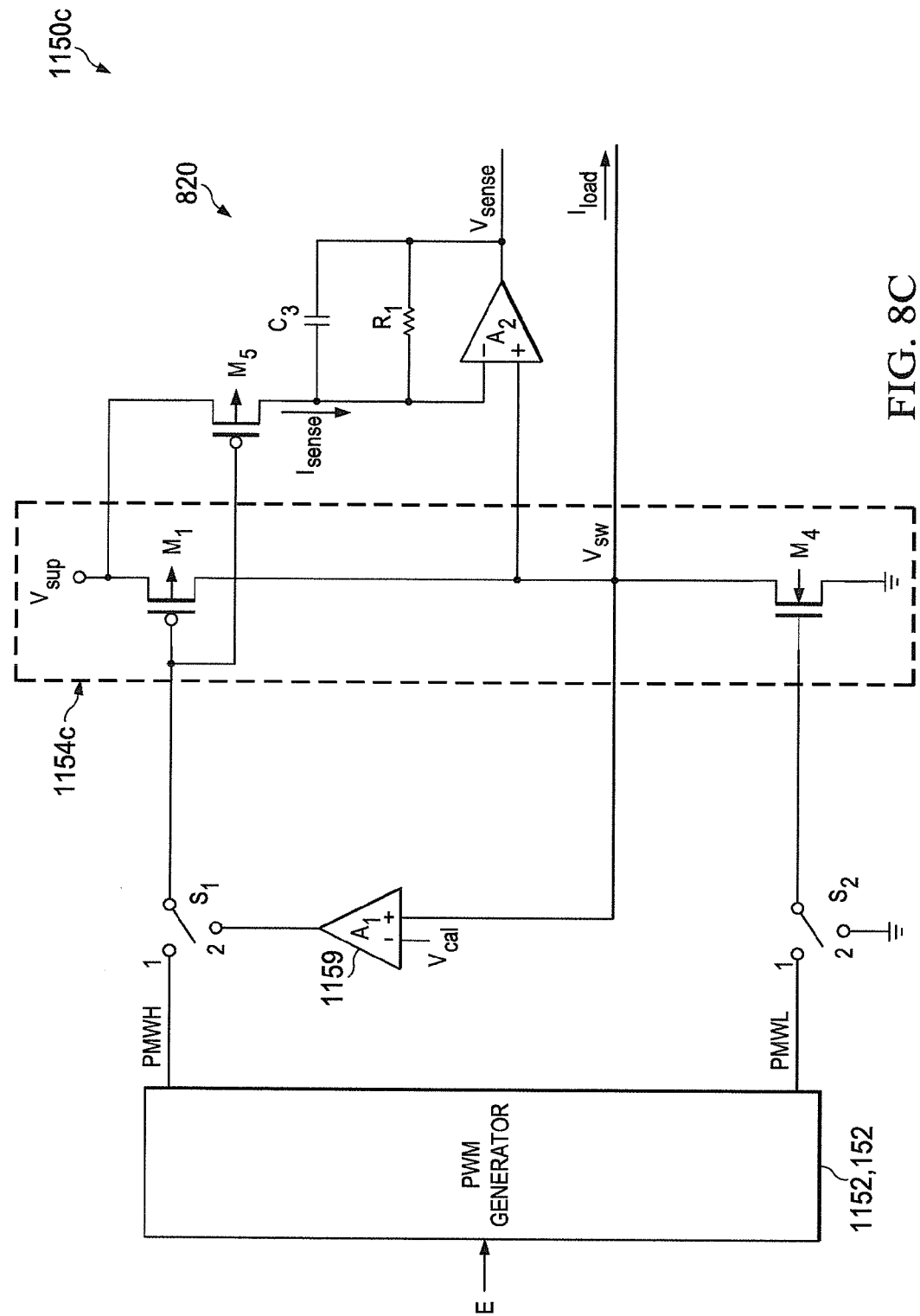

Now turning to FIG. 8C, there is provided a detailed diagram of another embodiment of the ET modulator 1150 (identified as 1150c) in accordance with the present disclosure. As will be appreciated, this embodiment is similar to the embodiment of FIG. 8A with the inclusion of an additional amplifier circuit 820. The ET modulator 1150c includes both the PWM generator 1152 (which can be the same or similar to the PWM generator 152 shown in FIG. 3) and a switch circuit 1154c which function together as a regulator. The regulator is reconfigurable or programmable to function as either a switching regulator or a linear regulator. The switch circuit 1154c is formed of a high side switch (transistor $M_1$) and a low side switch (transistor $M_4$). As will be appreciated, this switch circuit configuration may utilize cascade transistors (though not shown).

As with the prior embodiments, during a first mode of operation, the switches S1 and S2 are set to position 1, and the regulator operates or functions (is configured) as a switching regulator. When it is desired to measure the power amplifier (PA) impedance characteristic, during a second mode of operation (e.g., measurement or calibration mode), the switches S1 and S2 are set to position 2. In this configuration, the regulator operates or functions (is configured) as a linear regulator. In this second mode, the amplifier 1159 operates as the gain stage and the transistor $M_1$ (now operating as a current source rather than a switch) functions as the output device such that the output voltage $V_{SW}$ is equal to the voltage $V_{cal}$ at the inverting input of the amplifier 1159. Transistor $M_5$ forms a current mirror that generates a current $I_{sense}$ which is a scaled-down replica (scaling factor n) of the load current $I_{load}$ flowing through $M_1$ to the power amplifier 130 (not shown in FIG. 8C).

The additional amplifier circuit 820 (as shown in FIG. 8C) includes an amplifier A2 coupled to the resistor R1 and the capacitor C3 (see also, FIG. 6). This circuit functions to maintain the drain voltage of transistor $M_5$ equal to the drain voltage of transistor $M_1$ and also generates an average value of $I_{sense}$ and converts it to the voltage $V_{sense}$. This configuration provides similar accuracy as the embodiment of FIG. 8B, but without the range restriction on $V_{sense}$. As will be appreciated, the non-inverting input of amplifier A2 may be alternatively connected to $V_{cal}$ instead of $V_{SW}$.

Figure 8D:
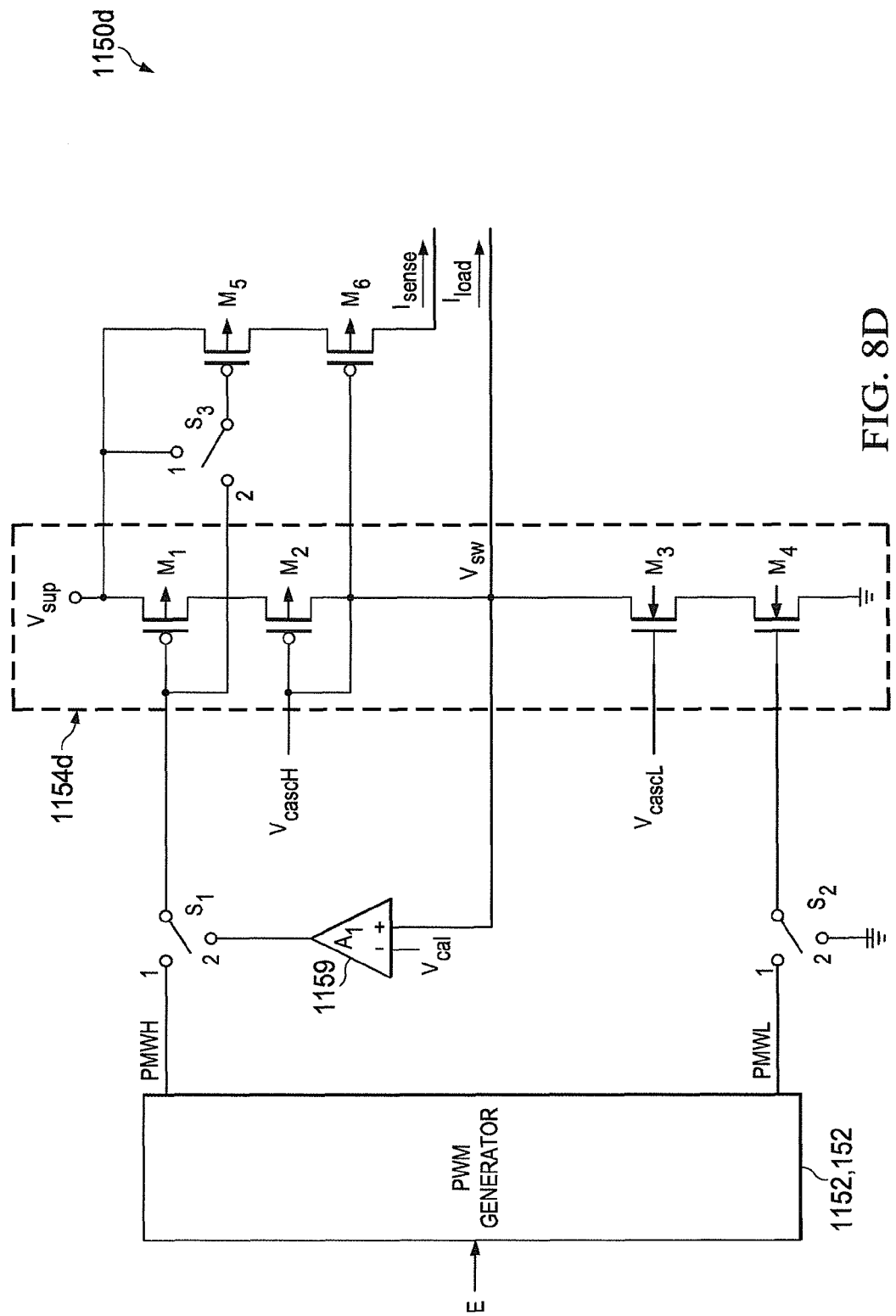

Now turning to FIG. 8D, there is provided a detailed diagram of another embodiment of the ET modulator 1150 (identified as 1150d) in accordance with the present disclosure. This embodiment is the same as the embodiment shown in FIG. 7, but with the inclusion of a switch S3. The ET modulator 1150d includes both the PWM generator 1152 (which can be the same or similar to the PWM generator 152 shown in FIG. 3) and a switch circuit 1154d which function together as a regulator. The regulator is reconfigurable or programmable to function as either a switching regulator or a linear regulator. The switch circuit 1154d is formed of a high side switch (transistors $M_1$ and $M_2$) and a low side switch (transistors $M_3$ and $M_4$) in a cascade configuration.

As with the prior embodiments, during a first mode of operation, the switches S1 and S2 are set to position 1, and the regulator operates or functions (is configured) as a switching regulator. When it is desired to measure the power amplifier (PA) impedance characteristic, during a second mode of operation (e.g., measurement or calibration mode), the switches S1 and S2 are set to position 2. In this configuration, the regulator operates or functions (is configured) as a linear regulator. In this second mode, the amplifier 1159 operates as the gain stage and the transistor $M_1$ (now operating as a current source rather than a switch) functions as the output device such that the output voltage $V_{SW}$ is equal to the voltage $V_{cal}$ at the inverting input of the amplifier 1159. Transistor $M_5$ forms a current mirror that generates a current $I_{sense}$ which is a scaled-down replica (scaling factor n) of the load current $I_{load}$ flowing through $M_1$ to the power amplifier 130 (not shown in FIG. 8C).

The additional amplifier circuit switch S3 (as shown in FIG. 8D) disables the current sensor during normal operation, when the ET modulator 1150d is operated as a switching regulator (normal mode), by connecting the gate of transistor $M_5$ to the primary supply voltage.

Figure 8E:
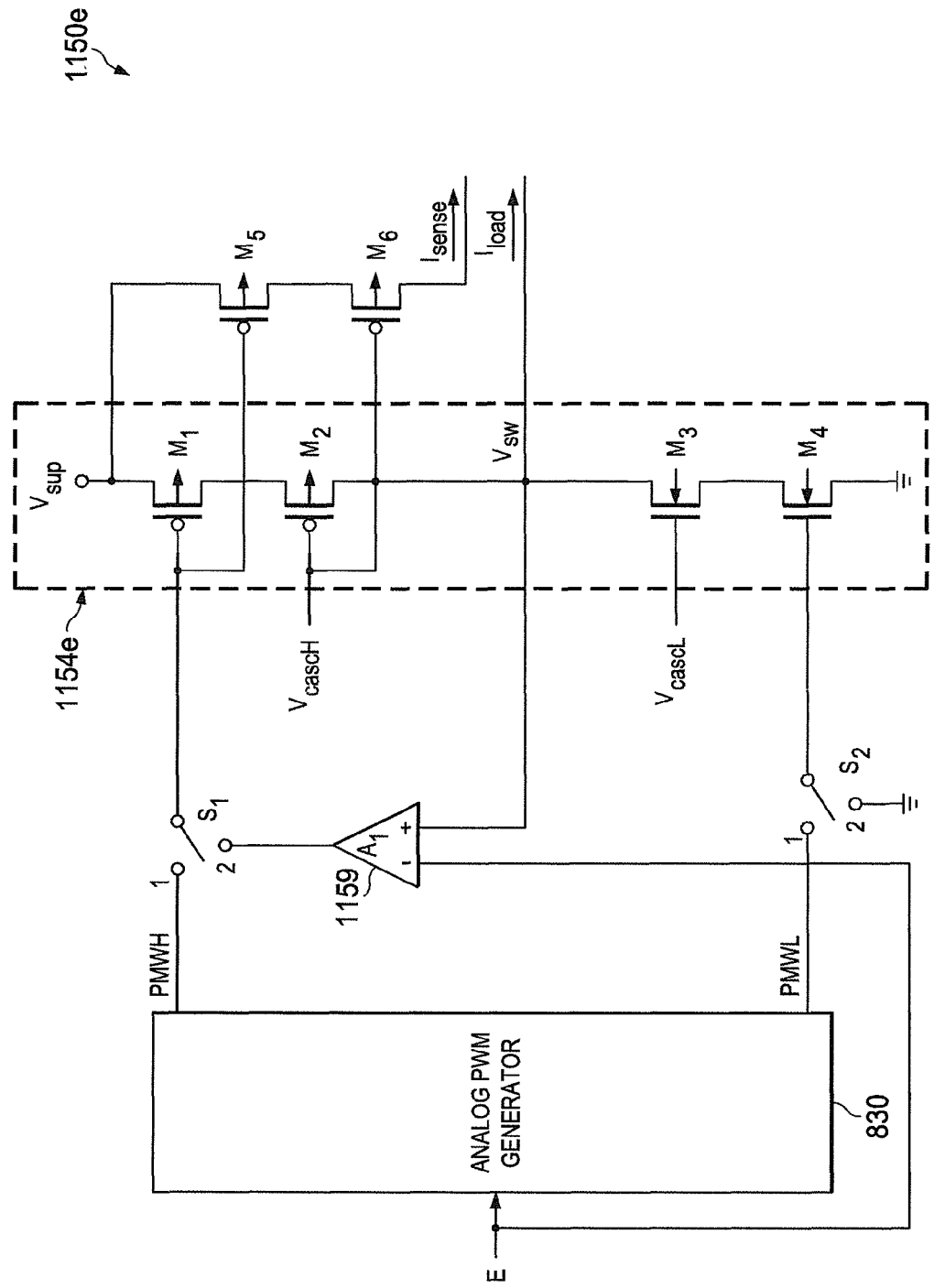

Now turning to FIG. 8E, there is provided a detailed diagram of another embodiment of the ET modulator 1150 (identified as 1150e) in accordance with the present disclosure. This embodiment is similar to the embodiment shown in FIG. 7. However, the ET modulator 1150d includes an analog PWM generator 820 and a switch circuit 1154d which function together as a regulator. The regulator is reconfigurable or programmable to function as either a switching regulator or a linear regulator. The switch circuit 1154d is formed of a high side switch (transistors $M_1$ and $M_2$) and a low side switch (transistors $M_3$ and $M_4$) in a cascade configuration.

As with the prior embodiments, during a first mode of operation, the switches S1 and S2 are set to position 1, and the regulator operates or functions (is configured) as a switching regulator. When it is desired to measure the power amplifier (PA) impedance characteristic, during a second mode of operation (e.g., measurement or calibration mode), the switches S1 and S2 are set to position 2. In this configuration, the regulator operates or functions (is configured) as a linear regulator. In this second mode, the amplifier 1159 operates as the gain stage and the transistor $M_1$ (now operating as a current source rather than a switch) functions as the output device such that the output voltage $V_{SW}$ is equal to the voltage envelope input E at the inverting input of the amplifier 1159. Transistors $M_5$ and $M_6$ form a current mirror that generates a current $I_{sense}$ which is a scaled-down replica (scaling factor n) of the load current $I_{load}$ flowing through $M_1$ to the power amplifier 130 (not shown in FIG. 8C).

The use of an analog PWM generator 830 (as shown in FIG. 8E) with an analog envelope input E allows E to be used as the calibration voltage input in calibration mode instead of requiring a separate input $V_{cal}$, as in FIG. 7.

As will be appreciated, in any of the foregoing embodiments except that of FIG. 8E, the PWM generator 1152, 152 could be either analog or digital, and the envelope input E could be either analog or digital.

Operation

Figure 12:
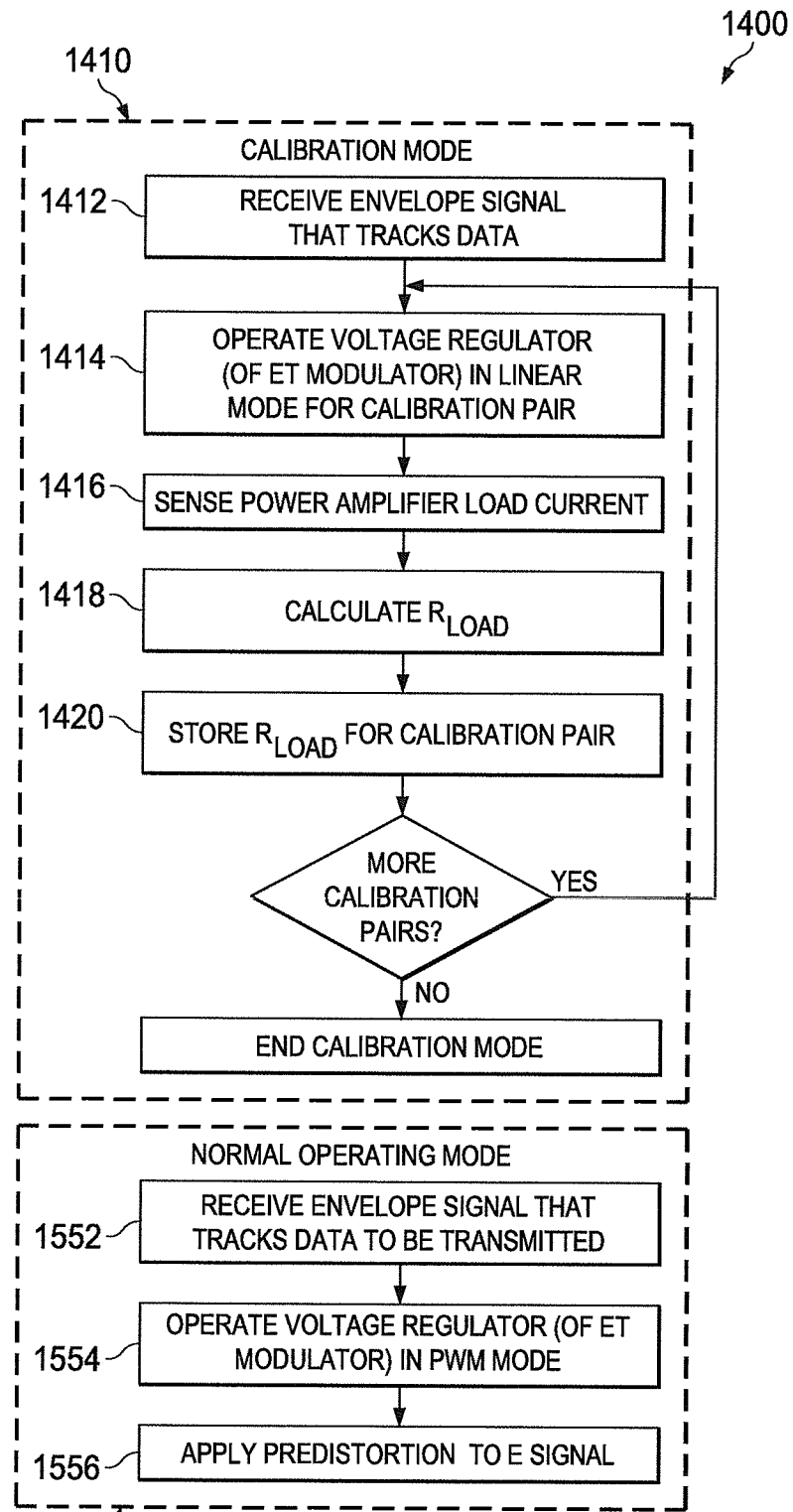
FIG. 12 illustrates a process 1400 for calibrating and operating the transmitter system in accordance with the present disclosure.

Now referring to FIG. 12, there is shown a process 1400 for calibrating and operating the transmitter system 1000 in accordance with the present disclosure. As will be appreciated, only the relevant steps/functions necessary for an understanding of the present disclosure are described herein.

It will be understood that the process 1400 may be illustrated to include two main processes or modes of operation—a calibration mode (or process) 1410 and a normal operating mode (or process) 1450. As will be appreciated, the calibration mode 1410 may be performed not only during manufacture, testing and calibration of the transmitter system 1000 (i.e., prior to deployment), but may also occur in response to certain events occurring during normal operation (i.e., during deployment and normal functioning for the intended communications services), such as a re-start process (e.g., repair or reboot) or at a predetermined time or in response to a predetermined event during normal operation. Thus, the calibration process may be performed statically or dynamically (such as a sub-process occurring within the normal operating mode).

During the calibration mode 1410, the ET modulator 1150 may receive an envelope tracking signal E that tracks the data input to the envelope generator 1140 (step 1412). It will be understood that the input data may be a set of predetermined or random data bits. However, this step can be omitted because the switch element 1154 is decoupled from the PWM generator 1152. In this mode, the switches S1 and S2 are set to position 2 (thereby decoupling the PWM generator 1152 from the switch element 1154). In this configuration, the voltage regulator 1151 operates or functions as a linear voltage regulator (also known as a low drop-out regulator or LDO) in a linear mode (step 1414). The amplifier 1159 operates as the gain stage and the transistors $M_1$ and $M_2$ operate as a cascode current source and function as the output device, such that the output voltage $V_{SW}$ is equal to the calibration voltage $V_{cal}$ at the inverting input of the amplifier 1159.

The calibration voltage $V_{cal}$ is generated from the digital-to-analog conversion (DAC 1175) of a calibration control signal output from the calibration control circuit 1170 (see, FIG. 6). As described earlier, in one particular embodiment, the calibration voltage $V_{cal}$ is varied in steps between the minimum and maximum values of the supply voltage $V_{CC}$ of the power amplifier 130 that will occur in normal operation (for example, $V_{cal}$ may be swept from 0.5V to 4.5V in steps of 0.1V). Meanwhile, at each value of $V_{cal}$, the calibration control circuit 1170 generates a power adjustment signal that causes the amplitude of the digital baseband signal components ID and QD to vary (e.g., by use of the power adjustment circuit 1190) in such a way that the power $P_X$ of the RF input signal X of the power amplifier 130 is varied in steps between the minimum and maximum values that will occur in normal operation (for example, $P_X$ may be swept from −40 dBm to 10 dBm in steps of 1 dB).

For each pair of values ($V_{cal}$, $P_X$), the calibration control circuit 1170 receives as an input the voltage $V_{sense}$ corresponding to the value of $I_{sense}$ measured by the sense circuit 1185 (step 1416) and calculates the load resistance $R_{load}$ (step 1418) as described above. The resulting two-dimensional table of $R_{load}$ values as a function of $V_{cal}$ and $P_X$ is stored in memory (step 1420).

During normal operation, the $R_{load}$ values generated and stored during the calibration process are used to generate the compensation signal (generated by the calibration control circuit) for controlling or applying predistortion within the envelope generator 1140. The form of the compensation signal depends on how predistortion is implemented. For example, the calibration control 1170 may serially output the $R_{load}$ values that it measures and the envelope generator 1140 may store these values in a look-up table used to calculate the distortion of the LC filter 1155 and apply a corresponding correction to the envelope signal E.

In the normal operation mode 1450, the ET modulator 1150 receives an envelope tracking signal E that tracks the data input to the envelope generator 1140 (step 1452). It will be understood that the input data will be the data transmitted by the transmitter system 1000. The switches S1 and S2 are set to position 1, thereby coupling the PWM generator 1152 to the switch element 1154 in the conventional manner. In this configuration, the voltage regulator 1151 operates or functions as a PWM voltage regulator in a PWM mode (step 1454). The amplifier 1159 is decoupled from the circuit, and the ET modulator 1151 functions conventionally.

During normal operation, the $R_{load}$ values generated and stored during the calibration process are used to generate the compensation signal (generated by the calibration control circuit 1170) which causes the envelope generator 1140 to apply predistortion to the envelope signal E (step 1556). The form of the compensation signal depends on how predistortion is implemented. For example, the calibration control 1170 may serially output the $R_{load}$ values that it measures and the envelope generator 1140 may store these values in a look-up table used to calculate the distortion of the LC filter 1155 and apply a corresponding correction to the envelope signal E. At each point in time, the envelope generator 1140 calculates the instantaneous value of the power of the RF input signal X of the power amplifier 130 and the required instantaneous value $V_{CC}$ of the supply voltage of the power amplifier. The corresponding instantaneous value of $R_{load}$ is then given by the entry in the look-up table for ($V_{cal}$, $P_X$), where $V_{cal}=V_{CC}$. From the values of $V_{CC}$ and $R_{load}$ as a function of time and the known dependence of the frequency characteristic of the LC filter 1155 on $R_{load}$, the envelope waveform generator calculates and outputs the envelope waveform E that will result in $V_{CC}$ having the required values as a function time.

As will be appreciated, the above description of the process 1500 is equally applicable to all of the embodiments described in FIGS. 8A-8E (and the embodiment shown in FIG. 8D will require an additional switch control for switch S3).

RF Communications Network

Figure 9:
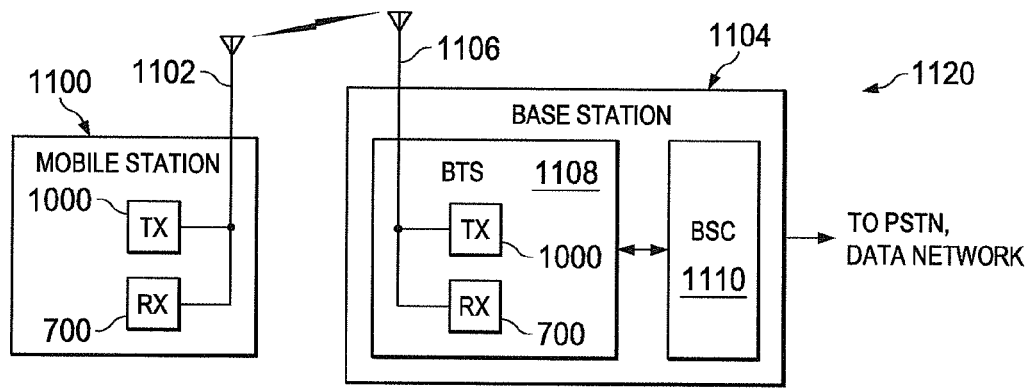
FIG. 9 illustrates an exemplary wireless communications network, including communication devices incorporating the transmitter system described in the present disclosure.

Now referring to FIG. 9, there is illustrated a block diagram of an exemplary wireless communications network 900. The wireless communications network 900 includes a first wireless communications device 1100 and a second wireless communications device 1104. The first wireless communications device 1100 is shown including the system 1000 as described above and in accordance with the present invention. Similarly, the second wireless communications device 1104 may also include the system 1000 as described above and in accordance with the present invention. It will be understood it is not necessary for both of the devices 1100 and 1104 to include the transmitter system 1000—either one or both may include the system 1000.

The two communications devices 1100 and 1104 communicate via RF signals utilizing an antenna 1102 and an antenna 1106, respectively, as shown.

The exemplary wireless communications network 900 may operate in accordance with one or more wireless protocols or technologies, such as CDMA, TDMA, FDMA, UMTS, LTE, etc. (and versions thereof). Further, the network 900 may support circuit-switched, and packet-switched or packet data communications.

In the embodiment in FIG. 9, the first communications device 1100 is illustrated as a mobile station or mobile terminal (or possibly fixed), such as a wireless handset, while the second communications device 1104 is illustrated as a base station, though not limited to such embodiment. The devices 1100, 1104 may be any device having wireless communications capabilities. As shown, the base station 1104 includes a base transceiver subsystem (BTS) 1108 that includes the system 1000. The BTS 1108 is connected to a base station controller (BSC) 1110. Collectively, the BTS 1108 and the BSC 1110 are logically referred to as the "base station" 1104. Multiple BTS 1108 sometimes share one BSC 1110. The BSC 1110 manages resource allocation among the several BTSs. More generally, the terms "base station" and "access network" refer to any entity (or collection of entities) that communicates wirelessly with mobile stations for communications sessions (e.g., circuit-switched or packet-switched). The base station 1104 is coupled to the public switched telephone network (PSTN) or other data or switched network. This path may include additional elements such as a mobile switching center (MSC)(not shown) coupled to the BSC 1110.

Though the devices 1100 and 1120 are shown to include a receiver 700 separate from the transmitter system 1000, it will be understood that the transmitter and receiver (or portions thereof) may be combined and form a "transceiver", or may be configured as one or multiple elements, and their characterization herein does not limit the devices 1100, 1120 or the transmitter 1000 or receiver 700.

Figure 10:
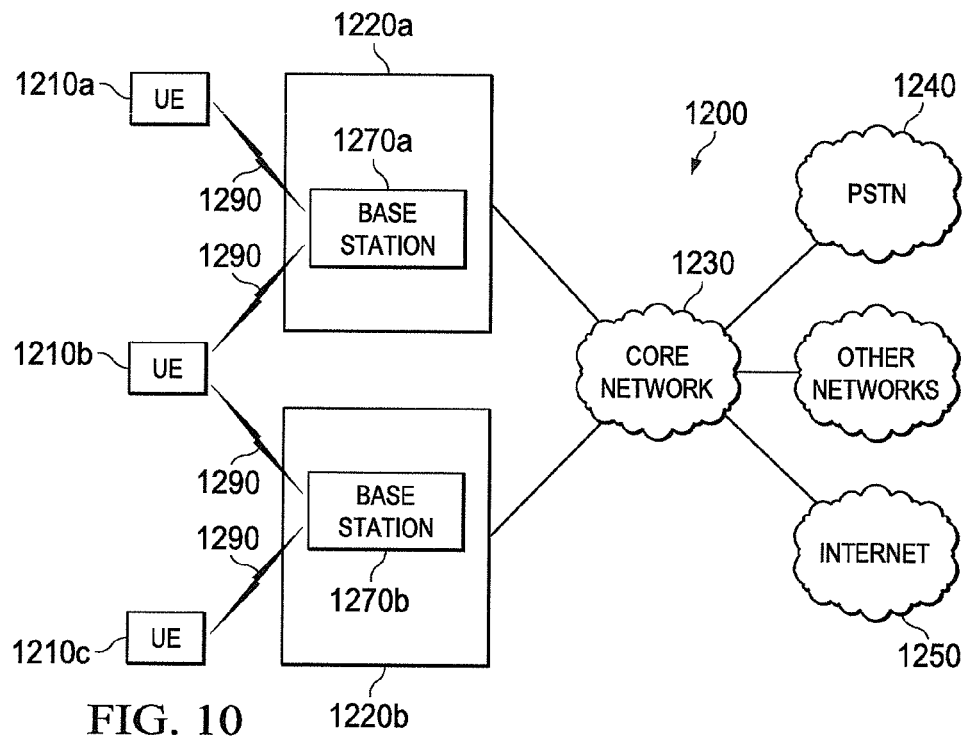
FIG. 10 is another embodiment of an exemplary wireless communications network, including communication devices incorporating the transmitter system described in the present disclosure.

The above identified methods/flows and devices may be incorporated into a wireless communications network and implemented in devices, such as that described below, and in the drawings below:

FIG. 10 illustrates another example communication system 1200 that utilizes the inventive envelope tracking modulator described herein. In general, the system 1200 enables multiple wireless users to transmit and receive data and other content. The system 1200 may implement one or more channel access methods, such as code division multiple access (CDMA), time division multiple access (TDMA), frequency division multiple access (FDMA), orthogonal FDMA (OFDMA), or single-carrier FDMA (SC-FDMA).

In this example, the communication system 1200 includes user equipment (UE) 1210a-1210c, radio access networks (RANs) 1220a-1220b, a core network 1230, a public switched telephone network (PSTN) 1240, the Internet 1250, and other networks 1260. While certain numbers of these components or elements are shown in FIG. 10, any number of these components or elements may be included in the system 1200.

The UEs 1210a-1210c are configured to operate and/or communicate in the system 1200. For example, the UEs 1210a-1210c are configured to transmit and/or receive wireless signals. Each UE 1210a-1210c represents any suitable end user device and may include such devices (or may be referred to) as a user equipment/device (UE), wireless transmit/receive unit (WTRU), mobile station, fixed or mobile subscriber unit, pager, cellular telephone, personal digital assistant (PDA), smartphone, laptop, computer, touchpad, wireless sensor, or consumer electronics device. As will be appreciated, one or more of the UEs 1210a-1210c may include the transmitter system 1000 in accordance with this disclosure.

The RANs 1220a-1220b here include base stations 1270a-1270b, respectively. Each base station 1270a-1270b is configured to wirelessly interface with one or more of the UEs 1210a-1210c to enable access to the core network 1230, the PSTN 1240, the Internet 1250, and/or the other networks 1260. For example, the base stations 1270a-1270b may include (or be) one or more of several well-known devices, such as a base transceiver station (BTS), a Node-B (NodeB), an evolved NodeB (eNodeB), a Home NodeB, a Home eNodeB, a site controller, an access point (AP), or a wireless router. As will be appreciated, one or more of the base stations 1270a-1270b may include the transmitter system 1000 in accordance with this disclosure.

In the embodiment shown in FIG. 10, the base station 1270a forms part of the RAN 1220a, which may include other base stations, elements, and/or devices. Also, the base station 1270b forms part of the RAN 1220b, which may include other base stations, elements, and/or devices. Each base station 1270a-1270b operates to transmit and/or receive wireless signals within a particular geographic region or area, sometimes referred to as a "cell." In some embodiments, multiple-input multiple-output (MIMO) technology may be employed having multiple transceivers for each cell.

The base stations 1270a-1270b communicate with one or more of the UEs 1210a-1210c over one or more air interfaces 1290 using wireless communication links. The air interfaces 1290 may utilize any suitable radio access technology.

It is contemplated that the system 1200 may use multiple channel access functionality, including such schemes as described above. In particular embodiments, the base stations and UEs implement LTE, LTE-A, and/or LTE-B. Of course, other multiple access schemes and wireless protocols may be utilized.

The RANs 1220a-1220b are in communication with the core network 1230 to provide the UEs 1210a-1210c with voice, data, application, Voice over Internet Protocol (VoIP), or other services. Understandably, the RANs 1220a-1220b and/or the core network 1230 may be in direct or indirect communication with one or more other RANs (not shown). The core network 1230 may also serve as a gateway access for other networks (such as PSTN 1240, Internet 1250, and other networks 1260). In addition, some or all of the UEs 1210a-1210c may include functionality for communicating with different wireless networks over different wireless links using different wireless technologies and/or protocols.

Although FIG. 10 illustrates one example of a communication system, various changes may be made to FIG. 10. For example, the communication system 1200 could include any number of UEs, base stations, networks, or other components in any suitable configuration.

Figure 11A:
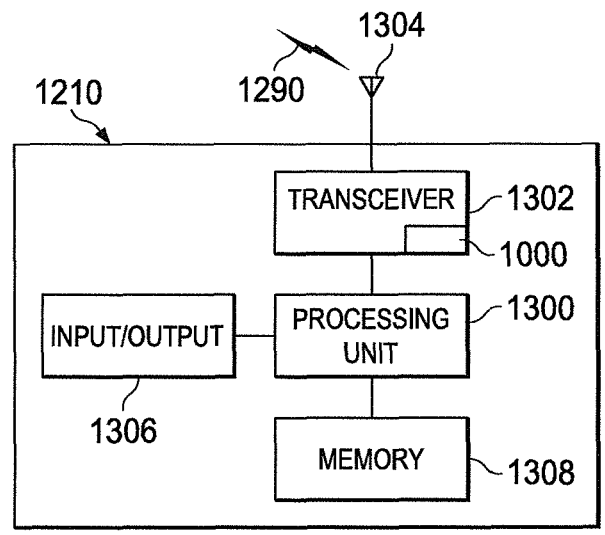
FIGS. 11A and 11B illustrate block diagrams of example devices that may implement the transmitter system and methods according to this disclosure.
Figure 11B:
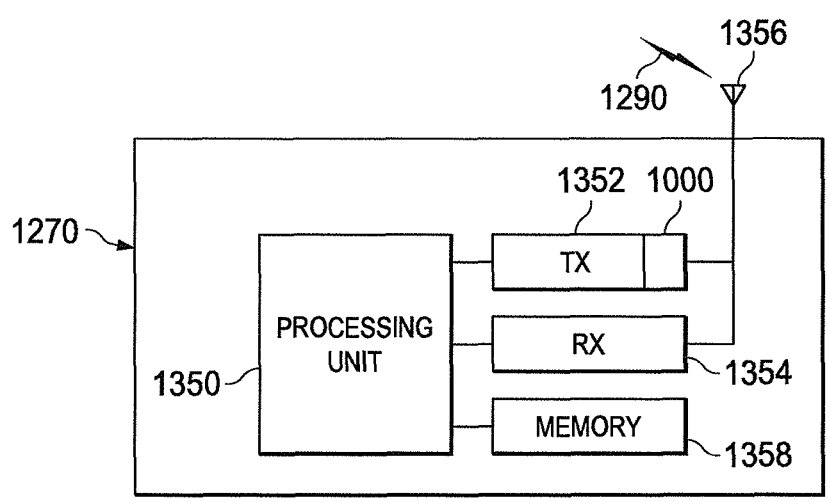

FIGS. 11A and 11B illustrate example devices that may implement the methods and teachings according to this disclosure. In particular, FIG. 11A illustrates an example UE 1210, and FIG. 11B illustrates an example base station 1270. These components could be used in the system 1200 or in any other suitable system.

As shown in FIG. 11A, the UE 1210 includes at least one processing unit 1300. The processing unit 1300 implements various processing operations of the UE 1210. For example, the processing unit 1300 could perform signal coding, data processing, power control, input/output processing, or any other functionality enabling the UE 1210 to operate in the system 1200. The processing unit 1300 also supports the methods and teachings described in more detail above. Each processing unit 1300 includes any suitable processing or computing device configured to perform one or more operations. Each processing unit 1300 could, for example, include a microprocessor, microcontroller, digital signal processor, field programmable gate array, or application specific integrated circuit.

The UE 1210 also includes at least one transceiver 1302, which includes the transmitter system 1000. The transceiver 1302 is configured to modulate data or other content for transmission by at least one antenna 1304. The transceiver 1302 is also configured to demodulate data or other content received by the at least one antenna 1304. Each transceiver 1302 includes any suitable structure for generating signals for wireless transmission and/or processing signals received wirelessly. Each antenna 1304 includes any suitable structure for transmitting and/or receiving wireless signals. One or multiple transceivers 1302 could be used in the UE 1210, and one or multiple antennas 1304 could be used in the UE 1210. Although shown as a single functional unit, a transceiver 1302 could also be implemented using at least one transmitter and at least one separate receiver.

The UE 1210 further includes one or more input/output devices 1306. The input/output devices 1306 facilitate interaction with a user. Each input/output device 1306 includes any suitable structure for providing information to or receiving information from a user, such as a speaker, microphone, keypad, keyboard, display, or touch screen.

In addition, the UE 1210 includes at least one memory 1308. The memory 1308 stores instructions and data used, generated, or collected by the UE 1210. For example, the memory 1308 could store software or firmware instructions executed by the processing unit(s) 1300 and data used to reduce or eliminate interference in incoming signals. Each memory 1308 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 11B, the base station 1270 includes at least one processing unit 1350, at least one transmitter 1352, at least one receiver 1354, one or more antennas 1356, and at least one memory 1358. The processing unit 1350 implements various processing operations of the base station 1270, such as signal coding, data processing, power control, input/output processing, or any other functionality. The processing unit 1350 can also support the methods and teachings described in more detail above. Each processing unit 1350 includes any suitable processing or computing device configured to perform one or more operations. Each processing unit 1350 could, for example, include a microprocessor, microcontroller, digital signal processor, field programmable gate array, or application specific integrated circuit.

Each transmitter 1352 includes any suitable structure for generating signals for wireless transmission to one or more UEs or other devices, and further includes the transmitter system 1000 described above. Each receiver 1354 includes any suitable structure for processing signals received wirelessly from one or more UEs or other devices. Although shown as separate components, at least one transmitter 1352 and at least one receiver 1354 (or components thereof) could be combined into a transceiver. Each antenna 1356 includes any suitable structure for transmitting and/or receiving wireless signals. While a common antenna 1356 is shown here as being coupled to both the transmitter 1352 and the receiver 1354, one or more antennas 256 could be coupled to the transmitter(s) 1352, and one or more separate antennas 1356 could be coupled to the receiver(s) 1354. Each memory 1358 includes any suitable volatile and/or non-volatile storage and retrieval device(s).

Additional details regarding UEs 1210 and base stations 1270 are known to those of skill in the art. As such, these details are omitted here for clarity.

In some embodiments, some or all of the functions or processes of the one or more of the devices are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory.

It may be advantageous to set forth definitions of certain words and phrases used throughout this patent document. The terms "include" and "comprise," as well as derivatives thereof, mean inclusion without limitation. The term "or" is inclusive, meaning and/or. The phrases "associated with" and "associated therewith," as well as derivatives thereof, mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A transmitter comprising:
an envelope generator configured to receive a data signal to be transmitted and generate an envelope signal based on the received data signal;
an envelope tracking (ET) modulator coupled to the envelope generator and configured to receive the envelope signal, the envelope tracking modulator comprising a pulse width modulation (PWM) generator and a switching circuit having a first output and a sense output, wherein the PWM generator and the switching circuit are configured to:
operate as a linear regulator in a first mode and generate a first power amplifier supply signal at the first output as a function of a calibration signal, and
operate as a switching regulator in a second mode and generate a second power amplifier supply signal at the first output as a function of the received envelope signal;
a current sensor circuit coupled to the sense output of the ET modulator and configured to sense current of the first power amplifier supply signal at the first output;
a filter coupled to the first output of the ET modulator for filtering the first output signal and generating a power amplifier switching supply source; and
a power amplifier coupled to the filter, wherein when in the second mode, the power amplifier is configured to:
receive the power amplifier switching supply source as a supply voltage,
receive and amplify a first transmitter signal generated from the data signal, and
output an amplified transmitter signal.

2. The transmitter in accordance with claim 1, wherein the ET modulator comprises means for coupling and decoupling the PWM generator to the switching circuit.

3. The transmitter in accordance with claim 2, wherein the means for coupling and decoupling comprises at least one switch.

4. The transmitter in accordance with claim 1, further comprising:
a calibration control circuit coupled to the envelope generator and the current sensor circuit and configured to:

generate and output the calibration signal to the envelope generator,
receive current sensing information from the current sensor circuit,
calculate load impedance of the power amplifier based on the current sensing information, and
storing the calculated load impedance.

5. The transmitter in accordance with claim 4, wherein the calibration control circuit is further configured to generate a compensation signal based on the stored load impedance for input to the envelope generator, and the envelope generator is further configured to predistort the envelope signal in response to the compensation signal.

6. The transmitter in accordance with claim 4, further comprising:
a power adjusting circuit coupled to the calibration control circuit and configured to adjust power of the data signal during the first mode.

7. The transmitter in accordance with claim 4 wherein the calibration control circuit calculates and stores a plurality of load impedances based on a plurality of values of the calibration signal.

8. The transmitter in accordance with claim 2, wherein the switching circuit comprises:
an amplifier configured to receive a calibration signal; and
a current mirror for outputting a current mirroring current flowing to the power amplifier.

9. A method of adjusting for variations in load impedance characteristics of a power amplifier in a transmitter comprising an envelope signal generator and an envelope tracking (ET) modulator, the ET modulator comprising a voltage regulator for supplying power to operate the power amplifier, the method comprising:
operating the voltage regulator as a linear voltage regulator in a first mode, wherein operating in the first mode comprises,
sensing power supplied by the voltage regulator to the power amplifier,
calculating load impedance information for the power amplifier, and
storing the calculated load impedance information; and
operating the voltage regulator as a switching voltage regulator in a second mode, wherein operating in the second mode comprises,
generating an envelope signal of data to be transmitted by the transmitter,
predistorting the envelope signal in accordance with the stored load impedance information, and
operating the switching voltage regulator according to the predistorted envelope signal.

10. The method in accordance with claim 9, further comprising:
decoupling a pulse width modulation (PWM) generator from a switching circuit in the first mode.

11. The method in accordance with claim 10 wherein decoupling is performed by at least one switch.

12. The method in accordance with claim 9, further comprising:
receiving a calibration signal during the first mode;
outputting a calibration voltage supply signal to supply power to the power amplifier;
sensing a current of the calibration voltage supply signal; and
calculating the load impedance of the power amplifier based on the sensed current.

13. The method in accordance with claim 12, further comprising:
generating a compensation signal based on the stored load impedance; and
predistorting the envelope signal in response to the compensation signal.

14. The method in accordance with claim 12, further comprising:
adjusting power of a data signal during the first mode.

15. The method in accordance with claim 12 further comprising:
calculating and storing a plurality of load impedances based on a plurality of values of the calibration signal.

16. The method in accordance with claim 10 further comprising:
receiving at an amplifier a calibration signal; and
mirroring current flowing to the power amplifier.

17. A transmitter comprising:
an envelope tracking (ET) modulator comprising,
a pulse width modulation (PWM) generator, and
a switching circuit having a first output and a second output, the first output coupled to a power amplifier, and
wherein the PWM generator and the switching circuit are configured to:
operate as a linear voltage regulator to supply power via the first output to the power amplifier during a calibration mode of operation, and
operate as a switching voltage regulator to supply power, as a function of an envelope signal, via the first output to the power amplifier during a normal mode of operation; and
a current sensor coupled to the second output and configured to sense current output from the first output to the power amplifier.

18. The transmitter in accordance with claim 17, further comprising:
a calibration control circuit coupled to the current sensor and configured to receive sensed current information calculate a load impedance of the power amplifier based on the current sensing information.

19. The transmitter in accordance with claim 17, further comprising:
an envelope generator configured to generate an envelope signal corresponding to data to be transmitted; and
wherein the calibration control circuit further generates a compensation control signal based on the calculated load impedance for input to the envelope generator.

20. The transmitter in accordance with claim 17, wherein the ET modulator further comprises:
a current mirror coupled to the switching circuit for generating the first output;
an amplifier coupled to the second output; and
a switch coupled between the PWM generator and the switching circuit and operable for decoupling the PWM generator from the switching circuit and coupling the amplifier to the switching circuit.

* * * * *